United States Patent [19]

Bhattacharya

[11] Patent Number: 4,514,751

[45] Date of Patent: Apr. 30, 1985

[54] COMPRESSIVELY STRESSES TITANIUM METALLURGY FOR CONTACTING PASSIVATED SEMICONDUCTOR DEVICES

[75] Inventor: Somnath Bhattacharya, Wappingers Falls, N.Y.

[73] Assignee: International Business Machines Corporation, Armonk, N.Y.

[21] Appl. No.: 452,542

[22] Filed: Dec. 23, 1982

[51] Int. Cl.³ ............... H01L 23/48; H01L 29/46
[52] U.S. Cl. .................................. 357/71; 357/67
[58] Field of Search ............................. 357/71, 67; 252/62.3 BT, 507, 520

[56] References Cited

U.S. PATENT DOCUMENTS

| | | | |
|---|---|---|---|
| 3,499,213 | 5/1970 | Lands et al. | 357/71 |
| 3,617,816 | 11/1971 | Riseman et al. | 317/234 R |
| 3,663,184 | 5/1972 | Wood et al. | 357/71 |
| 3,761,310 | 9/1973 | Preobrazhentsen et al. | 357/71 |
| 3,942,187 | 3/1976 | Henricus et al. | 357/71 |
| 4,096,510 | 6/1978 | Arai et al. | 357/28 |
| 4,109,297 | 8/1978 | Lesh | 361/402 |
| 4,176,443 | 12/1979 | Iannuzzi | 29/589 |
| 4,263,606 | 4/1981 | Yorikane | 357/71 |
| 4,290,079 | 9/1981 | Carpenter et al. | 357/71 |
| 4,434,434 | 2/1984 | Bhattacharya et al. | 357/67 |

OTHER PUBLICATIONS

IBM Technical Disclosure Bulletin, vol. 16, No. 1, Jun. 1973, "Multiple Reflow Titanium-Platinum Metallurgy", L. F. Miller, p. 39.

Primary Examiner—Martin H. Edlow
Assistant Examiner—Jerome Jackson
Attorney, Agent, or Firm—Robert J. Haase

[57] ABSTRACT

Contact metallurgy is disclosed for passivated semiconductor devices. The metallurgy comprises a compressively stressed, oxygen-containing titanium underlayer covered by a solder-bondable layer extending through via holes in dielectric material on the semiconductor device. The solder bondable layer is either nickel or ruthenium, where lower current densities are encountered or a composite of layers of copper, titanium, copper and gold for higher current densities.

11 Claims, 3 Drawing Figures

COMPRESSIVELY STRESSES TITANIUM METALLURGY FOR CONTACTING PASSIVATED SEMICONDUCTOR DEVICES

TECHNICAL DESCRIPTION

1. Technical Field

The invention generally relates to contact metallurgy for one or more levels of dielectrically passivated semiconductor devices and, more particularly, to the use of a compressively stressed titanium underlayer covered by a solder-bondable layer to contact the device through via holes in the dielectric passivation material.

2. Background Art

The need for an electrode providing low resistance contact through a passivation layer directly to a semiconductor substrate or to upper layer conductors over the substrate, without introducing unacceptable stress in the passivation layer, is recognized in the semiconductor art. For example, U.S. Pat. No. 4,096,510 deals with the fabrication of a silicon-based thermal printing head in which a heater portion of the silicon is to be contacted directly by an electrode. The patent teaches that molybdenum (Mo) or titanium (Ti) be used as an intermediate stress-buffering layer between an apertured passivation layer, through which the surface is to be contacted, and a solderable layer placed on the Mo or Ti layer. The patent notes that Mo and Ti have coefficients of thermal expansion close to that of silicon and a small Young's modulus and concludes that they are capable of serving as a layer for absorbing shearing stress from overlying layers. In one example, a solderable layer such as nickel, having a large coefficient of thermal expansion and a large Young's modulus, is placed upon a sufficiently thick layer of Mo or Ti without imposing a large shearing stress on the underlying silicon, according to the patent. The titanium is formed by vapor deposition or sputtering which do not necessarily introduce compressive stress into the titanium.

In another prior art instance, namely the IBM® Technical Disclosure Bulletin, Vol. 16, No. 1, June 1973 paper entitled "Multiple Reflow Titanium-Platinum Metallurgy", page 39, terminals for semiconductor solder pads are made metallurgically stable and resistant to heat treatment by the use of a titaniumplatinum composite layer. The titanium is deposited by sputtering.

There is also copending application Ser. No. 249,261, filed Mar. 30, 1981 in the names of S. Bhattacharya et al. for "Solder Mound Formation on Substrates" and assigned to the present assignee which teaches the use of tapered layers of contact metallurgy, including Ti-Cu-Au, to reduce "edge force" stress at the edge of the contact pad to thereby reduce concommitant cracking of the surrounding passivating layer. The titanium is not compressively stressed.

SUMMARY OF THE INVENTION

It has been found that a low stress contact made through a dielectric coating to an underlying semiconductor or conductor requires the use of a compressively stressed, oxygen-containing layer of titanium to effectively neutralize the inherent tensile stressed materials that are normally provided thereon to permit solder bonding to the contact. In a preferred embodiment where relatively light current density contact is to be made, a layer of compressively stressed titanium covered by nickel or ruthenium is used. In another embodiment where relatively heavy current density contact is desired, a composite metallurgy comprising compressively stessed titanium, copper, titanium, copper and gold is employed.

Compressive stress is introduced into the titanium when it is evaporated in the presence of an oxygen-containing ambient at a partial pressure between $5 \times 10^{-5}$ and $5 \times 10^{-6}$ Torr. Temperatures in the range of 100° C. to 300° C. are preferred.

BEST MODE FOR CARRYING OUT THE INVENTION

Figure 1:
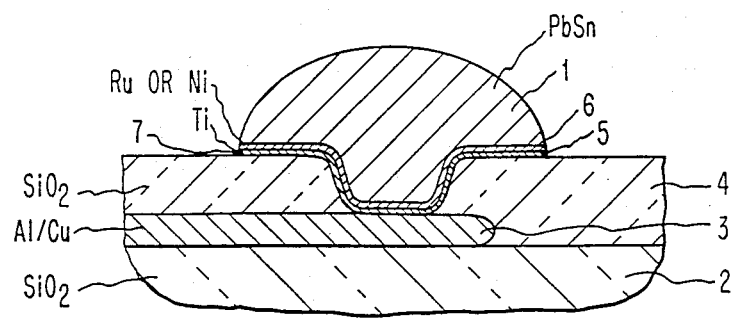
FIG. 1 is a cross-sectional sketch of contact metallurgy in accordance with a first embodiment of the invention adapted for relatively light current density.

Solder mound or ball 1 of FIG. 1 is used on semiconductor devices for "flip-chip" or face-down bonding to a supporting dielectric substrate. Silicon dioxide layer 2, in a typical instance, insulates second level chip-mounted metallurgy (not shown) from third level patterned metal 3. Silicon dioxide layer 4 insulates the third (topmost) level metal. Any coating selected from the group of glass, quartz, silicon dioxide and polymide compositions is suitable for use as layer 4. Connection is made to metal 3 through an aperture in layer 4 by solder ball 1 and contact metallurgy comprising compressively stressed titanium layer 5 and layer 6. In the embodiment of FIG. 1, wherein relatively low current density contact is desired, layer 6 is a tensively stressed solder-bonded material such as nickel or ruthenium.

As pointed out in the aforementioned copending patent application Ser. No. 249,261, the solder mounds or balls serve as active contacts when the semiconductor device, on which the balls are mounted, is flip-chip or face-down bonded to a dielectric supporting the substrate having a mirror image of mating contacts in registration with the chip solder ball terminals. Although this technique has been used extensively, the dielectric layer corresponding to SiO₂ layer 4 of FIG. 1 is vulnerable to cracking adjacent the solder balls especially when subjected to multiple solder reflows occasioned by engineering changes or in-service repairs.

The cracking problem is believed to be caused by residual stresses localized in the brittle passivating layer (e.g., layer 4) near the surface of the immediate vicinity surrounding the solder ball. These stresses are caused by an "edge force" from the solder ball which normally exhibits an intrinsic tensile stress. This tensile stress develops into an edge force at the abrupt edge 7 at the perimeter of the interface between solder ball 1 and SiO₂ layer 4. The edge force, unlike the balanced forces acting in the interior regions of the aforesaid interface, can cause the brittle passivating layer 4 to crack around the solder ball and can cause electrical discontinuity in addition to exposing the device to moisture and other harmful ambient impurities.

In accordance with the present invention, the edge force is reduced to an acceptable minimum or neutralized through the use of a compressively stressed intervening layer of titanium 5 which counteracts the normal tensile stress of solder ball 1 that otherwise would be manifested at edge 7. A layer of solderbondable material such as nickel or ruthenium interfaces layer 5 and ball 1.

It has been found that titanium becomes compressive when it is evaporated in the presence of $O_2$ or water vapor at a partial pressure in the range from about $5 \times 10^{-5}$ to about $5 \times 10^{-6}$ Torr. Various alternative gases may be used, e.g., pure $O_2$, waterbleed, $O_2 + N_2$, $O_2 + He$, $O_2 + Ar$. As titanium is evaporated under these conditions, $O_2$ adsorps on the surface of the titanium. Because of the relatively high interstitial solubility of oxygen in Ti, the oxygen penetrates into the titanium, thus making the titanium compressive. Temperatures in the range from about 100° C. to about 300° C. are preferred to enhance the $O_2$ diffusion into the Ti.

Titanium to nickel thicknesses in the range of about 2:1 (e.g., 10K Å Ti and 5K Å Ni) are suitable. When using ruthenium, the ratio is closer to 3:1 (e.g., 5–15K Å Ti and 2–5K Å Ru) because of the relatively high tensile stress in evaporated Ru. Consequently, thicker compressively stressed Ti is needed to counterbalance the tensively stressed Ru. A 1K Å layer of gold is optional on the ruthenium for environmental protection.

Figure 2:
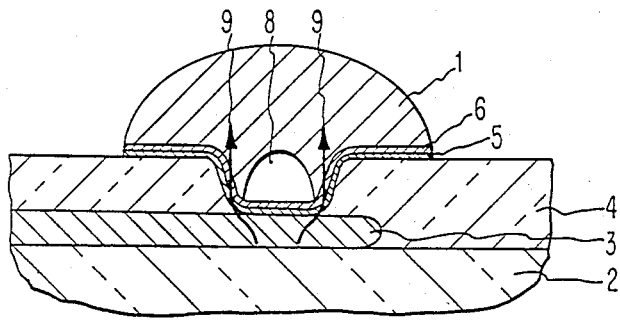
FIG. 2 is a cross-sectional sketch of the contact metallurgy of FIG. 1 undergoing deterioration due to electromigration under relatively high current density conditions and in the presence of a solder void that is often present in the solder ball.

FIG. 2 illustrates the situation where the contact metallurgy of FIG. 1 is subjected to relatively high current density and undergoes deterioration due to electromigration. As is well known, electromigration of contact metallurgy is increased as current density is increased. One cause of increased current density is the happenstance of a void 8 upon the formation of the solder ball 1 which forces the current flow into restrictive current paths around the perimeter of the void as shown by the arrows 9. Increased current flow over a wider region of the nickel or ruthenium layer 6 could be achieved through the use of increased thicknesses but this would cause residual tensive stresses which could not be fully counterbalanced by the compressive titanium layer 5.

Figure 3:
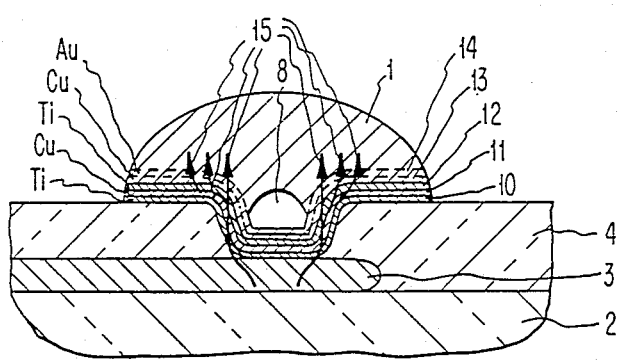
FIG. 3 is a cross-sectional view of a second embodiment of the invention which avoids the electromigration problem shown in FIG. 2.

FIG. 3 discloses a metallurgical combination of compressive titanium 10, copper 11, titanium 12, copper 13 and gold 14 which solves the high current density problem of FIG. 2 without reintroducing the quartz cracking problem associated with merely increasing the thickness of the layer 6 of FIG. 2. The copper layer 11 provides a low resistance pathway through extensive regions of the copper as shown by the arrows 15 thereby avoiding the current crowding and increased current density of FIG. 2 and substantially reducing electromigration of the current metallurgy. Thicknesses of 2K–20K, 10K–30K, 2K–5K, 1K–3K and 1K for layers 10, 11, 12, 13 and 14, respectively, are preferred.

The titanium layer 12 prevents interaction of the solder ball 1 and copper layer 11 in a manner more effective than the chromium barrier layer taught in U.S. Pat. No. 4,290,079, issued Sept. 15, 1981, in the names of Charles Carpenter et al. for "Solder Interconnection Between a Semiconductor Device and a Supporting Substrate" and assigned to the present assignee. The chromium of the cited patent, unlike the titanium of the present invention, permits some penetration of the tin from the solder into the bottom copper layer beneath the barrier layer, which becomes especially acute after multiple reflows of the solder resulting from engineering changes or repairs.

The $Cu_3Sn$ intermetallic thus formed in the reaction of Cu and Sn is prone to delamination from the underlying Cr metal.

I claim:

1. Contact metallurgy for an integrated semiconductor substrate having circuit elements therein, comprising:
   a dielectric coating on said substrate having an aperture therethrough for electrical connection to a said element in said substrate;
   a contact pad comprising
   a first layer of compressively stressed titanium covering said aperture and having peripheral portions extending on and bonded to said coating externally of said aperture, with said titanium having oxygen dispersed therein, and
   a second layer of solder bondable contact metallurgy concentrically formed on said first layer.

2. The structure of claim 1 wherein the thickness of said titanium is in the range of 2 to 20K angstroms.

3. The structure of claim 1 including a solder mound on said pad.

4. The structure of claim 1 wherein said coating is selected from the group of glass, quartz, silicon dioxide and polymide compositions.

5. The structure of claim 1 wherein said second layer comprises sequential films of copper, titanium, copper and gold.

6. The structure of claim 5 including a solder mound on said pad.

7. The structure of claim 5 wherein the thicknesses of said films are in the ranges of 10K–30K, 2K–5K, 1K–3K and 1K angstroms, respectively.

8. The structure of claim 1 wherein said second layer comprises a layer of nickel or ruthenium.

9. The structure of claim 8 including a solder mound on said pad.

10. The structure of claim 8 wherein the thickness of said second layer is in the range of 2–5K angstroms of ruthenium.

11. The structure of claim 1 wherein the oxygen is dispersed in said compressively stressed titanium by evaporation in an oxygen-containing ambient at a partial pressure between $5 \times 10^{-5}$ and $5 \times 10^{-6}$ Torr at a temperature in the range of 100° C. to 300° C.

* * * * *